United States Patent
McDonald (10) Patent No.: US 12,348,008 B2
(45) Date of Patent: Jul. 1, 2025

(54) METHOD AND APPARATUS FOR INTEGRATING SPARK GAPS INTO SEMICONDUCTOR PACKAGING

(71) Applicant: Atlas Magnetics, Reno, NV (US)

(72) Inventor: John Othniel McDonald, Reno, NV (US)

(*) Notice: Subject to any disclaimer, the term of this patent is extended or adjusted under 35 U.S.C. 154(b) by 0 days.

(21) Appl. No.: 18/581,118

(22) Filed: Feb. 19, 2024

(65) Prior Publication Data

US 2024/0195154 A1  Jun. 13, 2024

Related U.S. Application Data

(63) Continuation-in-part of application No. 17/842,768, filed on Jun. 16, 2022, now Pat. No. 11,948,934.

(51) Int. Cl.
*H01T 4/02* (2006.01)
*H01T 21/00* (2006.01)

(52) U.S. Cl.
CPC ............. *H01T 21/00* (2013.01); *H01T 4/02* (2013.01)

(58) Field of Classification Search
CPC .... H01T 4/00; H01T 4/02; H01T 4/04; H01T 4/06; H01T 4/08; H01T 4/10; H01T 4/12; H01T 4/14; H01T 4/16; H01T 4/18; H01T 4/20
USPC .......................................................... 445/7
See application file for complete search history.

(56) References Cited

U.S. PATENT DOCUMENTS

| | | | |
|---|---|---|---|
| 6,191,928 B1* | 2/2001 | Rector | H01H 69/022 361/111 |
| 6,215,251 B1* | 4/2001 | Orchard-Webb | H01T 4/08 315/209 M |
| 2010/0020458 A1* | 1/2010 | Yu | H01T 4/08 361/111 |
| 2010/0188791 A1* | 7/2010 | Nozoe | H01C 17/02 427/125 |
| 2012/0039010 A1* | 2/2012 | Tresness | H01T 4/08 361/112 |
| 2014/0126102 A1* | 5/2014 | Sumi | H05K 1/026 427/78 |
| 2016/0105947 A1* | 4/2016 | Suzuki | H01C 7/123 361/220 |
| 2020/0212033 A1* | 7/2020 | Chung | H10D 89/931 |

* cited by examiner

*Primary Examiner* — Christopher M Raabe
(74) *Attorney, Agent, or Firm* — Prorok Patents (57) ABSTRACT

The present invention is a spark gap capable of integrating into multiple layer semiconductor substrate packaging. The initial gap in the spark gap is solid and it can be converted into air, meaning gaseous, and the air gap is achieved by having the gap initially be filled with a solid and then running a voltage through the spark gap so that the gap explodes and the solid is replaced by an air cavity. The spark gap may be formed by initially electroplating electrodes through a dry film-based process, and then, to further close the gap between electrodes, beyond the practical limits of dry film, pigtail plating may be used. This pigtail plating may expand the electrodes and thus reduce the gap distance.

20 Claims, 10 Drawing Sheets

METHOD AND APPARATUS FOR INTEGRATING SPARK GAPS INTO SEMICONDUCTOR PACKAGING

BACKGROUND OF THE INVENTION

In general, the field of the present invention relates to semiconductors, and in particular, it relates to electrostatic discharge protection for semiconductors.

It is important to protect semiconductors to prevent the semiconductor circuit from being damaged by electrostatic discharge (ESD or Spark). Electrostatic discharge occurs when the voltage difference between two nodes exceeds the dielectric breakdown of the insulating material between the two nodes. Electrostatic build-up leads to electrostatic discharge and is often generated in normal manufacturing and operational environments, and is thus something that semiconductors must be designed to handle. As semiconductors get smaller, the potential impact of ESD increases.

One way ESD can damage circuits is by creating blow-outs that leave behind a hole in the circuit. This occurs when the voltage discharged during the ESD event exceeds the voltage breakdown threshold of the material to a high enough degree that the circuit material explodes.

A semiconductor is designed to protect against two main sources of ESD. The first source is humans, who may touch the semiconductor and cause an ESD event. To protect against this source of ESD, the semiconductor is designed to protect against a charge under the JEDEC 22-A114-B standard, which will model an ESD event from a human source, otherwise known as the human body model (HBM). Another source of ESD comes from metal-to-metal contact that may occur during manufacturing, commonly modeled in the industry as a charged device model (CDM). Semiconductor Integrated Circuits (ICs) are designed to protect against HBM and CDM. Various industry-standard protection levels depend on the application's environmental requirements. The most common HBM protection level is 2 kV for ICs.

To protect a semiconductor IC, there are a number of methods; the two most commonly used are 1) a diode from a pin to the IC's ground or power being used to shunt the ESD current off the IC die along an electrical path rated to support the ESD event. 2) A MOSFET switch that is turned on by the ESD event connects the pin to the IC's ground or power and is used again to shunt the ESD current off the IC die along an electrical path rated to support the ESD event. These ESD protective circuits consume IC die area and, in some cases, are a significant contributor to the cost of the IC. Thus, ESD solutions that consume less die area or provide higher ESD ratings for the same die area may be economically beneficial.

Spark gap devices are another way to protect circuits simply by placing a portion of the circuit to be protected close to a ground point at a location where little permanent damage will occur in the event of ESD. Spark gaps are widely used but are rarely found on the surface of ICs because the spark generated would blast a hole into the nearby circuit, and the necessary keep-out region would be costly to implement.

However, spark gaps are intrinsically simple, reliable, and usually inexpensive, and therefore, many attempts have been made to incorporate spark gaps into semiconductor packaging where the spark gap is far enough away from sensitive circuits yet still close enough to provide excellent ESD protection. These efforts have not exited the R&D phase due to:

Manufacturing tolerances require generating spark gaps that will spark at a low enough voltage to protect the fine and sensitive silicon integrated circuit embedded in the same package. Cost-competitive mainstream lead frame and substrate-based packaging technologies could not generate a gap size small enough to protect the silicon circuit.

Once the spark gap has blown in an ESD event, the next ESD event will be triggered at a different voltage level due to the epoxy plastic being degraded and replaced with various gasses that have a different ESD breakdown voltage.

Copper-based spark gap electrodes are excellent conductors, but the metal is soft and degrades with multiple ESD events, including but not limited to free-floating copper ions, which can greatly influence the spark gap performance.

The following United States patents and patent publications are incorporated in full by reference:

US 20210143111 A1: Package spark gap structure invented by Aleksandar Aleksov, Feras Eid, Johanna M. Swan, Adel A. Elsherbini, and Veronica Aleman Strong US 20170320726 A1: MEMS Package invented by Markus Leitgeb and Nick Renaud-Bezot U.S. Ser. No. 11/296,040 B2: Electrostatic discharge protection in integrated circuits invented by Adel A. Elsherbini; Feras Eid; Johanna M. Swan; Aleksandar Aleksov; and Veronica Aleman Strong US 20180190556 A1: Methods and apparatus for spark gap devices within integrated circuits invented by Barry Jon Male; Steve Kummerl; Robert Alan Neidorff; and Benjamin Stassen Cook U.S. Pat. No. 9,380,688 B1: Air gap electrostatic discharge structure for high speed circuits invented by Kai D. Feng; Yang Liu; Dongbing Shao; and Zheng Xu U.S. Ser. No. 11/112,436 B2: Spark gap structures for detection and protection against electrical overstress events invented by David J. Clarke; Stephen Denis Heffernan; Nijun Wei; Alan J. O'Donnell; Patrick Martin McGuinness; Shaun Bradley; Edward John Coyne; David Aherne; and David M. Boland U.S. Ser. No. 11/289,431 B2: Electrostatic discharge protection in integrated circuits using materials with optically controlled electrical conductivity invented by Feras Eid; Veronica Aleman Strong; Aleksandar Aleksov; Adel A. Elsherbini; and Johanna M. Swan U.S. Pat. No. 3,298,306 A: Electro-explosive device invented by Rolland M Purdy U.S. Pat. No. 3,564,682 A: Method of making a spark gap invented by Joseph J Carroll Jr; and Ferdinand A Rocchi U.S. Pat. No. 5,552,951 A: Semiconductor package electrostatic discharge damage protection invented by Nicholas F. Pasch and William Gascoyne U.S. Pat. No. 6,355,958 B1: Spark gap for hermetically packaged integrated circuits invented by Jonathan Harry Orchard-Webb U.S. Pat. No. 6,323,599 B1: Vertical spark gap for microelectric circuits invented by Jonathan Harry Orchard-Webb U.S. Pat. No. 7,349,189 B2: Electrical surge protection using in-package gas discharge system invented by James Michael Hopkins US 20110149452 A1: Surface mount spark gap invented by David Scott Whitefield and Kenneth Warren U.S. Pat. No. 8,999,835 B2: Method and structure of monolithically integrated ESD suppression device invented by Xiao (Charles) Yang U.S. Pat. No. 6,628,498 B2: Integrated electrostatic discharge and overcurrent device invented by Whitney Steven J.; Maercklein Nate; Deblieck Rob; and Davidson Scott U.S. Pat. No. 6,215,251B1: Spark gap for high voltage integrated circuit electrostatic discharge protection invented by Jonathan Harry Orchard-Webb U.S. Pat. No. 7,508,644B2: Spark gap apparatus and method for electrostatic discharge protection invented by Tim O. Cheung and Douglas Edgar Fregin U.S. Pat. No. 5,969,924A: Spark gap for overcoated printed circuit boards invented by Robert H. Noble U.S. Pat. No. 5,933,307A: Printed circuit board sparkgap invented by Charles E. West The following foreign patent publications are incorporated in full by reference:

FR2507402A1: Gas filled spark gap overvoltage protector— uses low pressure gas filled cylinder contg. two electrodes and moulded in dual-in-line epoxy plastics package invented by Frangois Guichard WO2009098553A1: Embedded spark gap invented by Idris Omerovic The following study is incorporated in full by reference: Rodríguez-Serna, J. M., Albarracin-Sanchez, R., Dong, M., & Ren, M. (2020). Computer simulation of partial discharges in voids inside epoxy resins using three-capacitance and analytical models. Polymers, 12(1), 77.

BRIEF SUMMARY OF THE CURRENT INVENTION

An exemplary embodiment of the present invention comprises a spark gap wherein there are two electrodes spaced 12 microns apart or less, and the gap between them is filled with a solid such as epoxy plastic, for example, epoxy with a glass bead filling as embodied in semiconductor industry standard Ajinomoto Build Up film. One electrode is connected to the integrated circuit's external input or output port, and the other electrode is connected to the IC's ground or power.

For low impedance, the electrodes may be copper, which is excellent for providing a preferential path for an ESD event. It is worth noting that other materials besides copper may be used to form the electrodes, for example nickel. However, copper is the most common electrode material. The downside with copper is that it softens and degrades in an ESD event, and thus, in an exemplary embodiment of the invention, the copper can be coated in either Nickel, Nickel Phosphorus or an alloy of Nickel-Iron, all of which are much harder than copper and leave few metal ions floating in the gaseous atmosphere near the electrodes shortly before and after the ESD event. Ni, NiP, and NiFe are all metals widely used in the industry with well-known safety, environmental, and performance standards.

In an exemplary embodiment of the invention, the glass-filled epoxy plastic is able to support high-resolution electroplated metal, with metal-to-metal spacing down to about 5 μm, with an exemplary embodiment around 12 μm.

In at least one exemplary embodiment, pigtail electroplating may be used. In fact, pigtail plating may be used in conjunction with standard dry film electroplating processes. The electrodes may be formed up to within 5 microns of each other by dry film. The dry film is then removed, and a pigtail plating procedure is used. Because pigtail plating deposits on the existing metal, the electrodes will receive a metal deposit and grow in size. They can grow in size under this method until each electrode of an electrode pair touches the other. However, to maintain a spark gap, it is considered best practice to leave a gap of at least one micron.

Thus, in at least one exemplary embodiment, a spark gap is formed by plating at least two electrodes, forming at least one electrode pair having an initial gap and a pigtail operably connected to the electrodes; expanding the electrodes by subjugating the electrodes to a pigtail plating process forming a secondary gap; and embedding the electrodes and the gaps in a semiconductor plastic.

It is worth noting that the pigtails or a portion of the pigtails before encapsulating the electrodes in a semiconductor plastic.

Pigtail plating may also help soften the edges and corners of an electrode and can be a method for depositing an alternate metal onto the electrode, which can increase electrode survivability.

In an exemplary embodiment, each sensitive circuit to be protected may be protected by more than one spark gap, such that if a spark gap degrades (or widens) after an ESD event, another "fresh" spark gap still has nearly an identical distance as the original spark gap.

In an exemplary embodiment, the multilayer substrate is built incorporating both the epoxy plastic and the spark gaps before the IC is attached for final assembly. The spark gaps can thus be tuned by pre-sparking: generating an initial spark that creates a new gap and surrounding atmosphere at a known and measured voltage. An additional spark can be generated if the first spark fails to achieve the desired result. This is not possible with a standard lead frame type of IC because the sensitive silicon circuit is attached before the epoxy plastic is molded around it. This technique is also not effective for more common build-up films that do not have a high level of glass filler. The ability to pre-spark the package also allows for guaranteed performance, which is necessary given the small manufacturing tolerances required.

However, in an exemplary embodiment of the invention, epoxy plastic has a breakdown voltage threshold of approximately 30,000 volts per inch, which will vary according to the exact formulation of epoxy plastic. When a strong enough ESD event occurs, the solid epoxy plastic between the two electrodes explodes. This replaces the epoxy plastic in the gap between electrodes with a gas-based gap, which can further lower the breakdown voltage of the gap. Because the gap is epoxy plastic-based, the spark gap can be incorporated into multi-level semiconductor substrate packaging, and the value of the voltage necessary to trigger an ESD event can be tuned. For example, an epoxy plastic with a breakdown at 900 volts at 12 microns can be triggered on purpose while unattached to the sensitive silicon circuit. The resulting explosion leaves behind an air gap between the two electrodes, which, for example, now has a voltage breakdown of approximately 300 volts. In this example, the spark gap can now protect the semiconductor IC against ESD events with voltages of 300 or higher, which is about 600 volts lower than the epoxy plastic that originally filled the gap. After or by the explosion, the cavity may be filled with air, carbon dioxide, or other gasses that form as a result of the spark reaction.

An exemplary embodiment of the present invention comprises a spark gap with two electrodes 12 microns or less apart. However, as need or purpose may dictate in alternative embodiments, the gap between the electrodes may be larger. One such factor that may increase the needed size is the severity of an ESD explosion that the gap is designed to accommodate. However, as the goal is to reduce the voltage needed to shunt the spark, a smaller gap has a lower breakdown voltage and is usually preferred.

In an exemplary embodiment of the invention, the gap between the electrodes is filled with epoxy plastic. In one exemplary embodiment of the invention, the epoxy plastic has a tuned low breakdown voltage, for example, approximately 360 volts at 12 microns, thus reducing the ESD voltage the target IC is subjected to. This is important because the semiconductor IC is made to handle any voltage below the threshold of protection elements such as power switches and diodes. By lowering the ESD voltage on the inputs of the IC, the IC die size can be reduced due to less ESD protection required.

When epoxy plastic explodes, the size of the cavity left behind tends to be in the micron range. Thus, to keep the hole within the confines of the spark gap, the electrodes can be shaped or reinforced by plating or both. In an exemplary embodiment of the invention, the electrodes forming the gap have a triangle shape with a point facing the gap or in the alternative, are rounded for more robustness. A rounded shape will be able to survive more ESD events intact, whereas a triangle shape may be better at directing the ESD event. The electrodes may be but are not limited to nickel, copper, copper-plated nickel, nickel-iron, or nickel-phosphorus for less metallic damage after an ESD event. Here, plated refers to a secondary coating of metal that is formed over the initial metal of the electrode, thus plating it like a suite of armor.

In at least one exemplary embodiment, the use of copper gives the electrodes low impedance, and to further increase the strength of the electrodes, they may be plated with nickel, a steel alloy, titanium, or material with similar properties. Increasing the surface strength of the electrodes gives the electrodes better survivability across multiple ESD events. This is important as the electrodes can be melted by significant ESD events or be damaged by the exploding gap material.

There may be more than one electrode pair per spark gap. An ESD event will normally only affect one electrode pair in the spark gap. So, if one pair of electrodes is damaged, the next ESD event will spark across the next electrode pair in the spark gap. This allows for at least one ESD event per electrode pair in the spark gap. This is a simple and low-cost technique to gain protection for multiple ESD events. Further, by using copper, and especially by using plated copper, the electrodes are less susceptible to damage. So, multiple ESD events can occur per each electrode pair in the spark gap. In theory, this allows for the spark gap to protect the semiconductor IC from multiple ESD events.

In part due to the use of epoxy plastic, an exemplary embodiment of the present invention is capable of incorporation directly into multi-layer semiconductor substrate packaging. The incorporation of the spark gap into the multi-level semiconductor substrate packaging allows for a significantly reduced die size and lowers the cost of the semiconductor. While the electrode design allows for repeated use of the spark gap.

Further, because of the low voltage breakdown threshold in the spark gap, the degree of ESD protection is high—the spark gap is able to protect against lower voltage ESD. Lowering the voltage allows for the spark gap to be used in smaller, more sensitive circuits. The lower voltage also reduces the burden on a circuit engineer to build a circuit that can handle higher voltages.

By using materials that are commonly found in semiconductor packaging, the spark gaps can be built on the same layers for nearly zero additional cost as other embedded substrate circuits. For example, a substrate that incorporates both copper traces and an inductor using magnetic metals can also build a robust spark gap for no additional cost, as the layers and materials are already incorporated.

DETAILED DESCRIPTION

In the present invention, a spark gap is embedded in semiconductor epoxy plastic. An initial voltage discharge event, such as an electrostatic discharge (ESD), will cause the gap material of the spark gap to explode. The electrodes of the spark gap are made strong enough to survive an explosion. The exploded material of the spark gap will leave a combusted cavity that is roughly shaped. The combusted cavity gap can serve as what can be referred to as an air or gas gap as it will be filled with gas from the explosion or environment or both. The survival of the electrodes and the creation of a combusted cavity allows the spark gap to handle multiple ESD events.

Figure 1A:
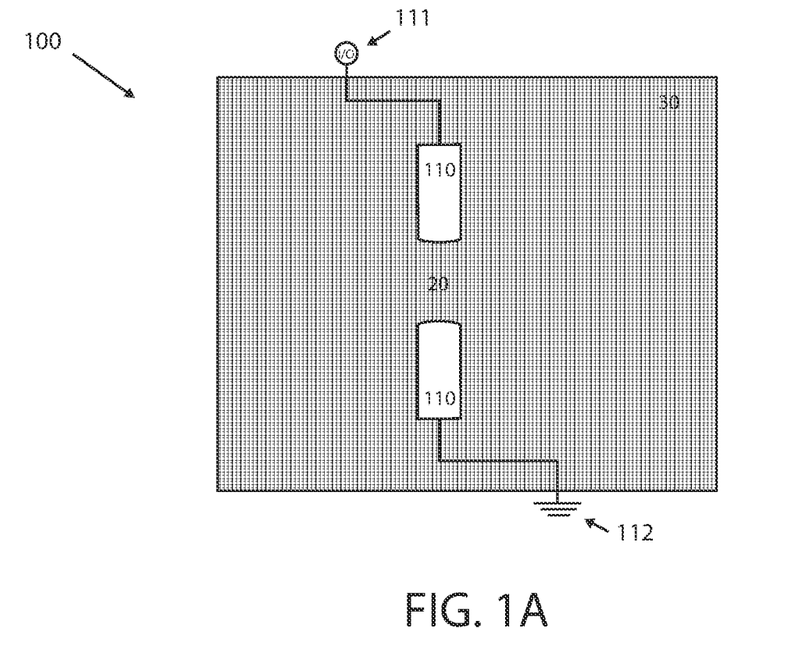
FIG. 1A Is a top-down cross-sectional view of a single electrode pair embodiment with an epoxy plastic-filled gap.
Figure 1B:
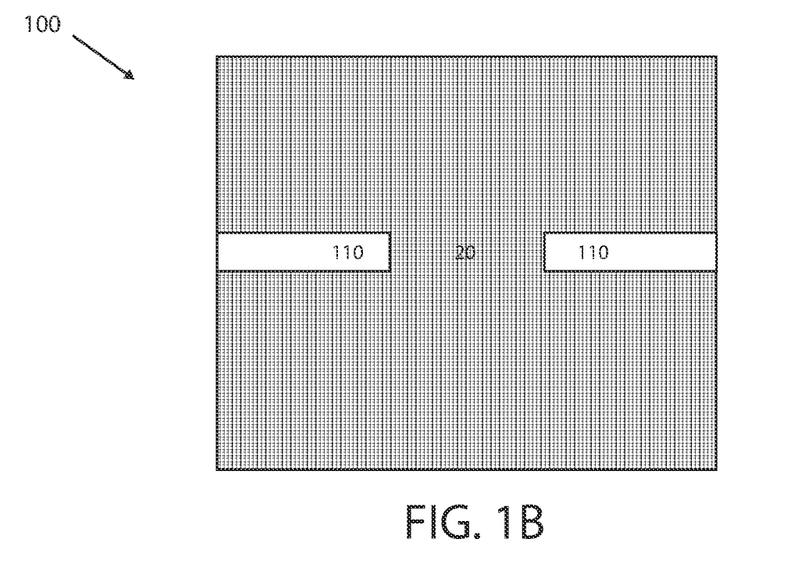
FIG. 1B Is a side cross-sectional view of a single electrode pair embodiment with an epoxy plastic-filled gap.

FIG. 1A and FIG. 1B depicts an elegant embodiment of the present invention: a spark gap apparatus 100, which is a spark gap comprised of at least two electrodes 10; one electrode is connected to an I/O 111, and the other electrode is connected to a ground 112, between the electrodes there is a gap 20 that is twelve microns or less across, and a semiconductor packaging epoxy plastic 30 encapsulates the spark gap. This forms a spark gap completely embedded in a semiconductor packaging epoxy plastic 30. There is no cavity—the gap between the electrodes is a solid epoxy plastic. The spark gap is able to be incorporated into semiconductor packages on the leading edge of minimization as well as the leading edge of multi-layer packaging as apparatus 100 also occurs on a micron-scale and incorporates the epoxy plastic packaging. Further, due to their location, connecting electrodes to the IC is a simple procedure.

FIG. 1A shows a top-down cross-section of the spark gap and FIG. 1B shows a side-view cross-section of the same spark gap. Therefore, it can be seen that the spark gap 100 is entirely encapsulated by semiconductor packaging epoxy plastic. This gives the embodiment its elegance, as it is able to integrate into a wide variety of semiconductor packages cheaply and quickly. The invention is highly compatible with Ajinomoto epoxy plastics, and an exemplary embodiment of the present invention incorporates black build-up film as the epoxy plastic 30. However, a wide variety of epoxy plastics may be utilized by the present invention.

Figure 2:
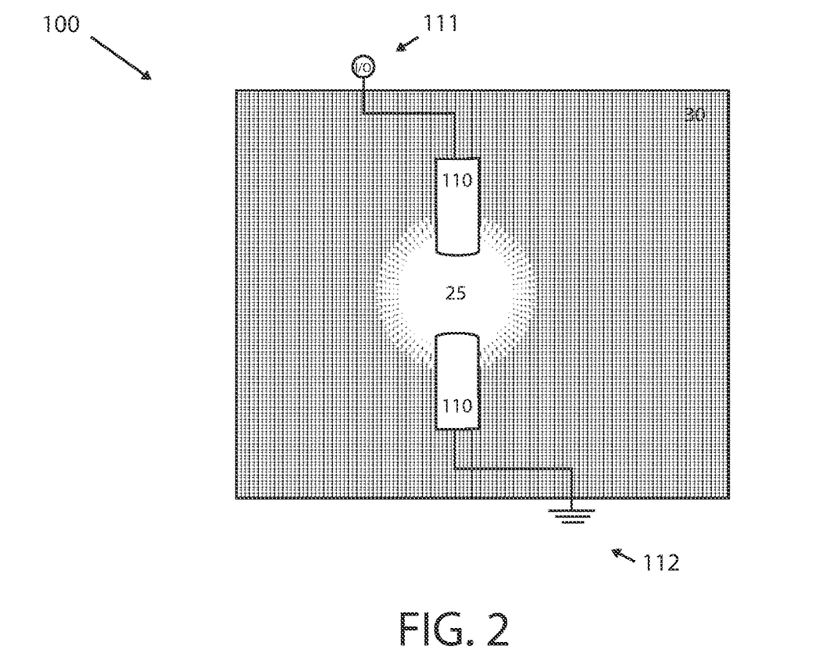
FIG. 2 Is a top-down cross-sectional view of a single electrode pair embodiment with a combusted cavity gap.

When a high voltage event, for example, an electrostatic discharge, occurs a spark is generated across the gap 20 and that spark can violently explode any epoxy plastic 30 in gap 20 leaving a gas gap as shown in FIG. 2. The gas gap can be referred to by three names: combusted cavity, gas gap, and air gap. After or by the explosion, the combusted cavity may be filled with air, carbon dioxide, or other gasses that form as a result of the spark reaction. By controlling the properties of the electrodes 10 and the epoxy plastic 30 the creation of a gas gap can, in this manner, be beneficial and be tuned to provide a specific level of ESD voltage protection. The benefits include a low-cost, tunable, and simple gas gap that can handle multiple discharge events. Further, in embodiments with rows of electrode pairs, the order of the spark gap discharges can be controlled.

Packaging epoxy plastics can have different breakdown voltages as there are a wide variety of packaging epoxy plastics possible so there are a wide range of epoxy plastic breakdown voltages available. The present invention incorporates at least two ways of reducing the voltage required to spark the gap. The first is to shrink the gap, and the second is to change the gap material.

As for the first, because dielectric breakdown is a function of area, the smaller the gap between electrode pairs, the smaller the required voltage to initiate an ESD event. A spark gap at 12 microns in plastic might require 900 volts to spark. However, a spark gap in the same material that is only 1 micron across might only require 75 volts to initiate a spark. It will be appreciated that the energy dispersed across the spark gap will be the same at both 75 volts and 900 volts.

As for changing the material of the gap, in exemplary embodiment of the invention, an epoxy plastic, for example, an epoxy plastic with a breakdown at 900 volts at 12 microns, receives an ESD event with a high enough voltage to cause breakdown and to explode the epoxy plastic. This ESD event may be triggered on purpose before the spark gap is to be used. The resulting explosion leaves behind an air gap between the two electrodes, which, for example, has a voltage breakdown of approximately 300 volts. In this example, the spark gap can now protect the semiconductor IC that will be later attached to the substrate against ESD events with voltages of 300 or higher, which is about 600 volts lower than the epoxy plastic that originally filled the gap.

Figure 4:
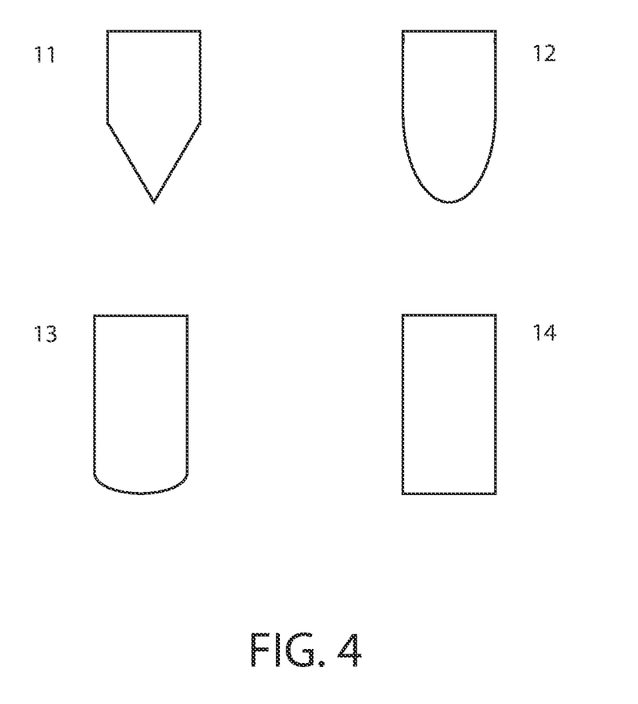
FIG. 4 Is a top-down view of a variety of electrode head shapes.

With reference to FIG. 2, it can be seen that the combusted cavity gap 25 may reach the ends of the electrodes 10. There are several design elements that are taken in various embodiments of the present invention to improve the survivability of the electrodes 10. The first design element is the shape of the electrode in FIG. 2 the electrode comes to a rounded point. The rounded point is more resistant to the explosion that occurred in the gap 25 but still provides some directional influence on the spark. Other electrode shapes can be implemented, and several are shown in FIG. 4, where 11 is a sharp-angled point, 12 is a rounded angle, 13 is a rounded electrode, and 14 is a flat surface. More shapes may be made, and the angles and angle softness may vary among embodiments.

Figure 5:
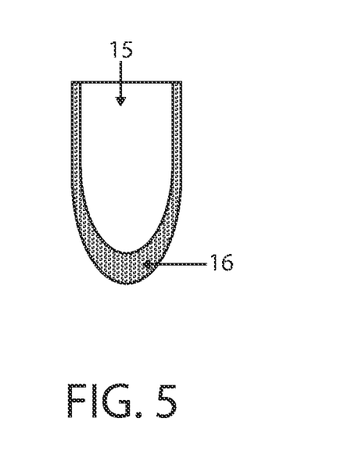
FIG. 5 Is a top-down cross-sectional view of a single-plated electrode.

A second design element is the material of the electrodes 10. The electrodes 10 are copper. Copper is used for its low impedance. The resistance of the electrode to damage can be further controlled by a third design element: plating the electrodes 10, which is shown in FIG. 5, where 15 is the initial electrode material and 16 is the plated material. The electrodes may be plated with a stronger metal, including titanium, steel alloy, or nickel. (A copper electrode is especially suited for being plated with nickel as nickel will prevent copper ions from interacting with the gap.) Plating helps to ensure that the spark gap can operate over multiple ESD events even as the epoxy plastic of the gap material is blown out, leaving a combusted cavity gap 25, as shown in FIG. 2. The plating of the electrode can also enable more angled electrode shapes by adding structural strength to the electrode with a weaker shape, such as a sharply pointed electrode.

Further, when epoxy plastic explodes, the size of the combusted cavity left behind tends to be in the micron range. Thus, using metal electrodes, shaping the electrodes, reinforcing them by plating, or doing all three to the electrodes helps keep the combusted cavity within the confines of the spark gap.

The design of the electrodes and the placement of the electrodes in the semiconductor epoxy plastic enable a spark gap to handle higher voltages than otherwise and survive multiple discharge events while being small enough to be relevant as semiconductor technology continues to miniaturize as well as being backward compatible into a wide variety of semiconductor packaging designs and types. An exemplary embodiment of the present invention is capable of incorporation directly into multi-layer semiconductor substrate packaging. Because of, but not limited to, the size, ease of manufacturing, level of protection, and location of the spark gap, this invention reduces the required die size and cost of ESD protection while increasing the survivability of the IC over multiple ESD events.

Figure 3:
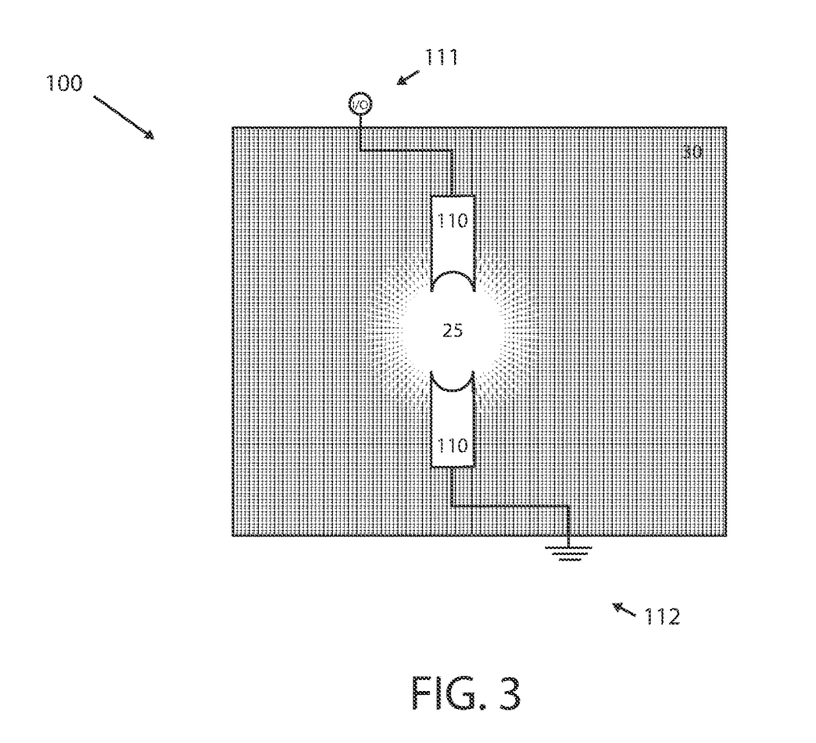
FIG. 3 Is a top-down cross-sectional view of a single electrode pair embodiment with a combusted cavity gap where the electrodes are heavily damaged.

An elegant embodiment and the stages of its life cycle (the point from when the spark gap apparatus is made to when it is no longer operable) are shown in FIG. 1A, FIG. 2, and FIG. 3. As shown by FIG. 1, the spark gap 100 contains one electrode pair of electrodes 10 and is embedded fully in epoxy plastic at the start of its lifecycle. The second life cycle stage is shown in FIG. 2 and occurs after an initial ESD event. In this stage, a combusted cavity 25 in the epoxy plastic 30 will present the medium that the spark will travel through. The third and final life cycle stage of the spark gap occurs after the electrodes melt or are damaged so that they are no longer operable.

The transition from the first stage to the second stage occurs after an initial discharge event. This event can be triggered by a user or manufacturer of the spark gap on purpose to transition the spark gap to the second stage, or it can be left for happenstance in the daily life of the system. A user may wish to transition to the second stage, as this will ensure a specific breakdown voltage and enable the spark gap to protect against lower voltages. In the first stage, a partial discharge may occur, and this may delay the transition into the second stage, giving the first state the ability to handle multiple discharges. In embodiments where there are multiple electrode pairs, each pair will have its own lifecycle.

In the second stage, multiple ESD events may occur until the electrodes are melted or damaged in some manner so as to be inoperable. Once inoperable, the third stage is entered and is shown in FIG. 3 where the electrodes 10 are now heavily damaged. A heavily damaged electrode is one that will no longer take a spark within a voltage threshold to be useful for protecting the device. This transition from a second stage to a third stage is important when considering more sophisticated embodiments.

In this elegant embodiment of the invention shown in FIG. 1A-FIG. 3, the electrodes forming the gap may have any of the above-discussed shapes, but the rounded angle shape as shown, is currently preferred. A rounded angle shape will be able to survive more ESD events than a sharply angled point. In this embodiment, the electrodes may be but are not limited to copper or nickel. The use of copper or nickel gives the strength of the electrode. To further increase the strength of the electrodes they may be plated with nickel, nickel-iron alloy, a steel alloy, titanium, or material with similar properties. Many configurations of a single electrode pair may be made without exceeding the scope of the invention.

Figure 6:
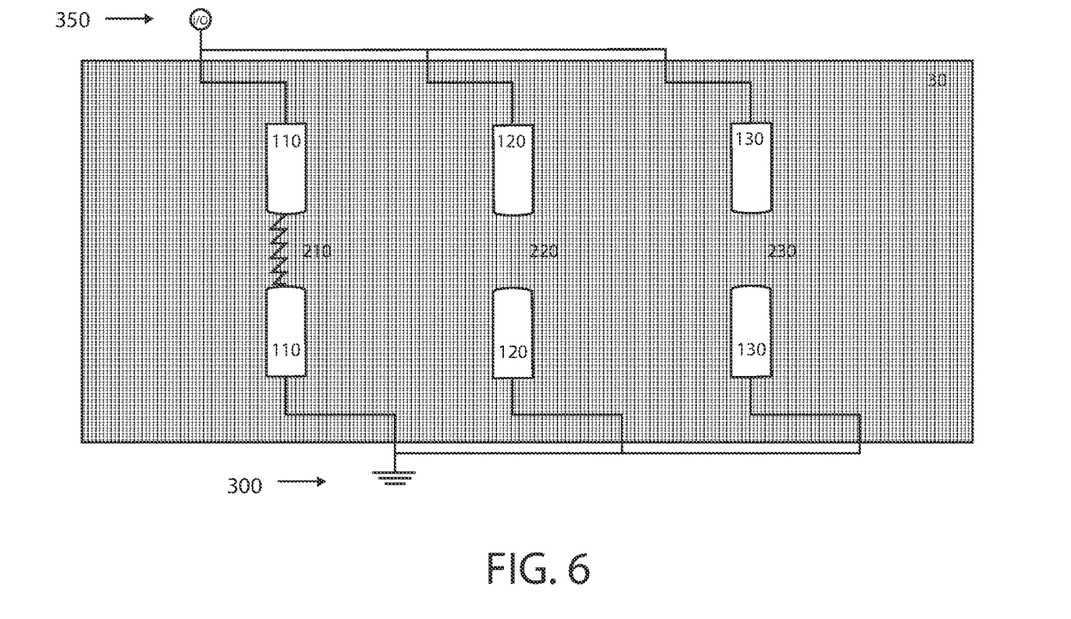
FIG. 6 Is a top-down cross-sectional view of a spark gap with three electrode pairs where the epoxy plastic they are embedded in has a higher breakdown voltage than the gas of the combusted cavity gap as an initial spark is arcing across a gap.

Embodiments can include multiple electrode pairs per spark gap. One such embodiment is shown in FIG. 6, where there are three electrode pairs, electrode pair 110, electrode pair 120, and electrode pair 130. Each electrode pair has a gap 210, 220, and 230 associated with it and all electrodes connect to either a ground 300 or an input/output 350. The electrode pairs 110, 120, and 130 form a row of electrodes. By incorporating multiple electrode pairs into a single spark gap, the longevity of the spark gap is increased without a significant increase in cost. This embodiment is embedded in semiconductor epoxy plastic 30 and all gaps 210, 220, and 230 consist at the stage shown in FIG. 6 as a solid semiconductor epoxy plastic.

In an exemplary embodiment, the spark gap is embedded in epoxy plastic thus the first discharge will be over solid epoxy plastic. However, the order in which the electrode pairs discharge across the gap after an initial electrode pair completes the transition to the second stage of the lifecycle is primarily determined by the semiconductor epoxy plastic. When the semiconductor epoxy plastic creates the gas gap it will run through its life cycle stages before the next electrode pair is triggered. When the semiconductor epoxy plastic has a lower breakdown voltage than air each epoxy plastic electrode will transition into the second stage before the air gap will be utilized.

Figure 7:
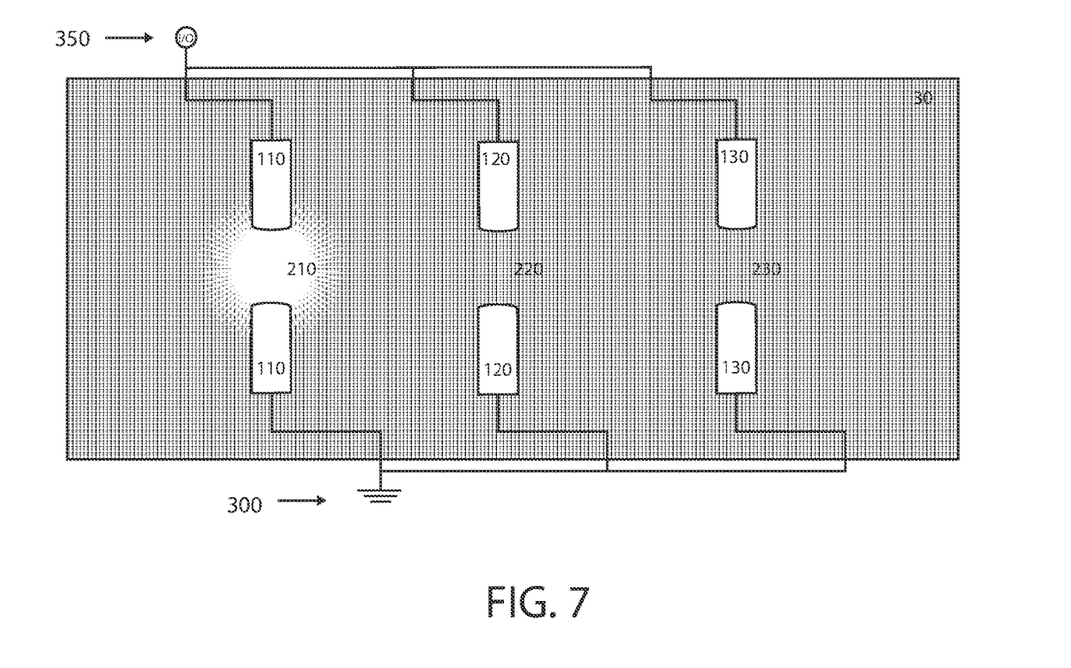
FIG. 7 Is a top-down cross-sectional view of a spark gap with three electrode pairs where the epoxy plastic they are embedded in has a higher breakdown voltage than the gas of the combusted cavity gap with an initial spark tuning the gap.
Figure 8:
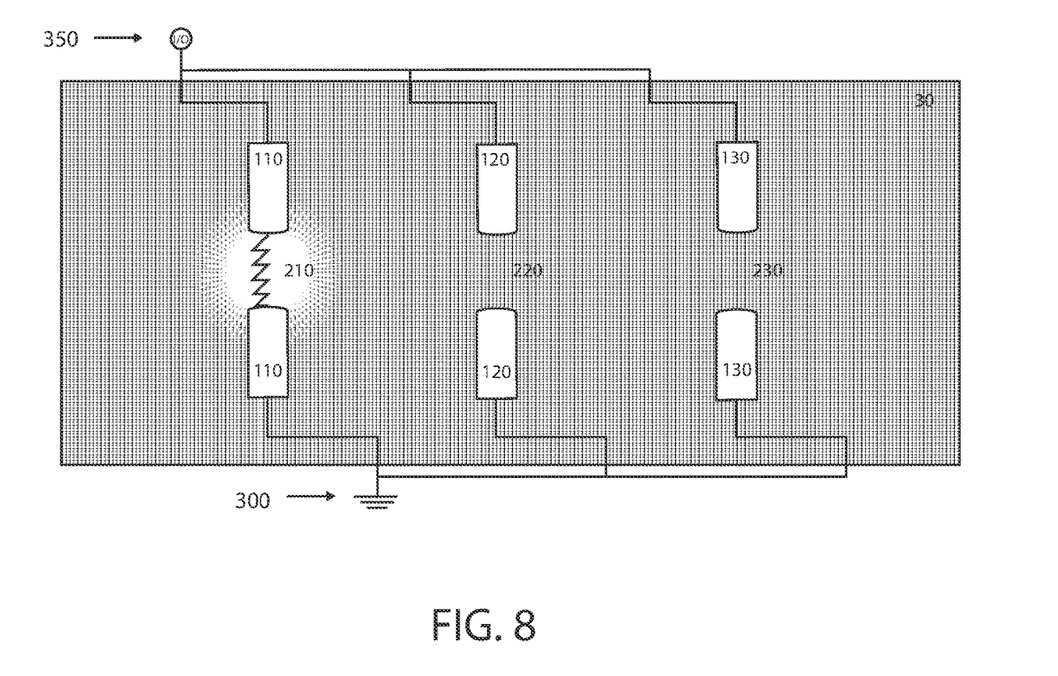
FIG. 8 Is a top-down cross-sectional view of a spark gap with three electrode pairs where the epoxy plastic they are embedded in has a higher breakdown voltage than the gas of the combusted cavity gap with a spark crossing an initial combusted cavity.
Figure 9:
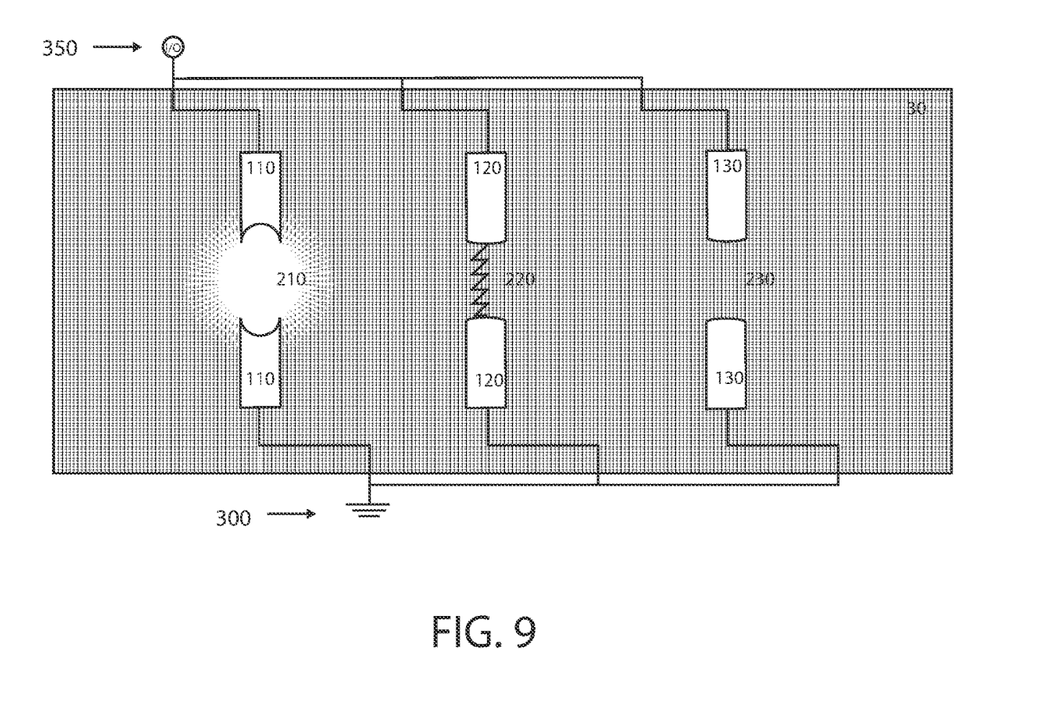
FIG. 9 Is a top-down cross-sectional view of a spark gap with three electrode pairs where the epoxy plastic they are embedded in has a higher breakdown voltage than the gas of the combusted cavity gap with the electrodes of the initial cavity broken and a spark crossing a second epoxy plastic filled gap.

In the embodiment denoted by FIG. 6, where the epoxy plastic 30 has a higher breakdown voltage than a potential combustion cavity gap, the first electrode pair to hold a spark will be an electrode pair that has an epoxy plastic gap and this is shown in FIG. 6 as a spark occurs between electrode pair 110. After this spark occurs a combusted cavity gap as shown in FIG. 7 will form. The next discharge will occur in this combusted cavity 210 as shown by FIG. 8. This air gap 210 is designed to continue to take a plurality of ESD events and it will do so until as shown by FIG. 9 its associated electrode pair 110 becomes damaged and inoperable. At this point a surviving electrode pair having a solid epoxy plastic gap will receive the next ESD event, as shown in FIG. 10, and as such the ESD protection the whole spark gap apparatus offers will be temporarily raised to that of the epoxy plastic.

Figure 10:
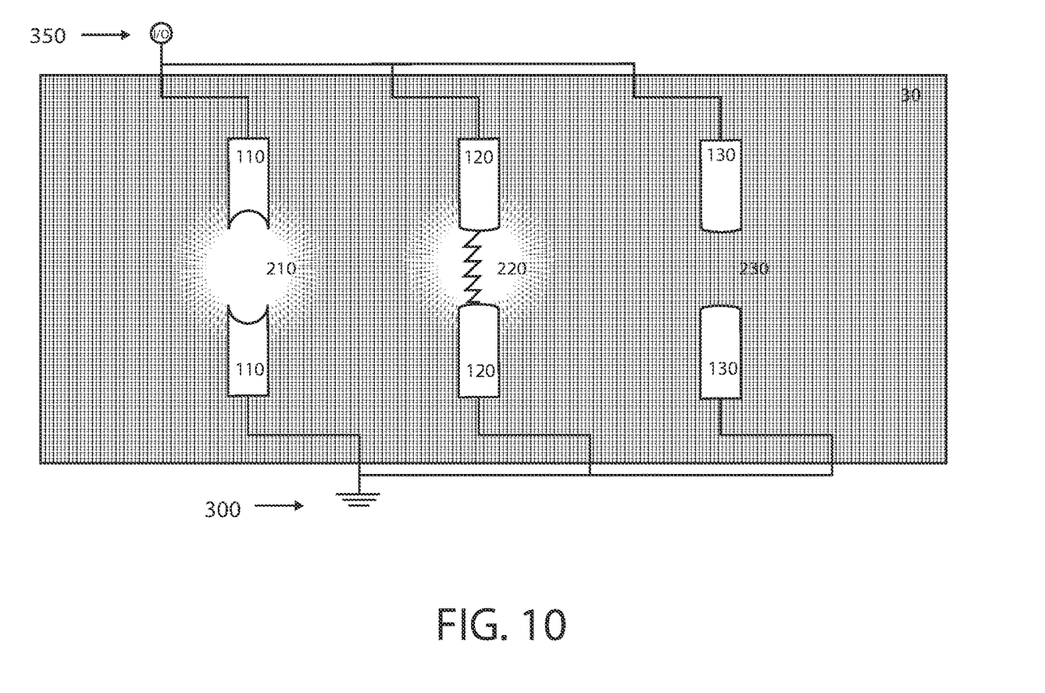
FIG. 10 Is a top-down cross-sectional view of a spark gap with three electrode pairs where the epoxy plastic they are embedded in has a higher breakdown voltage than the gas of the combusted cavity gap, with the second gap now being a combusted cavity and a spark crossing that cavity.
Figure 11:
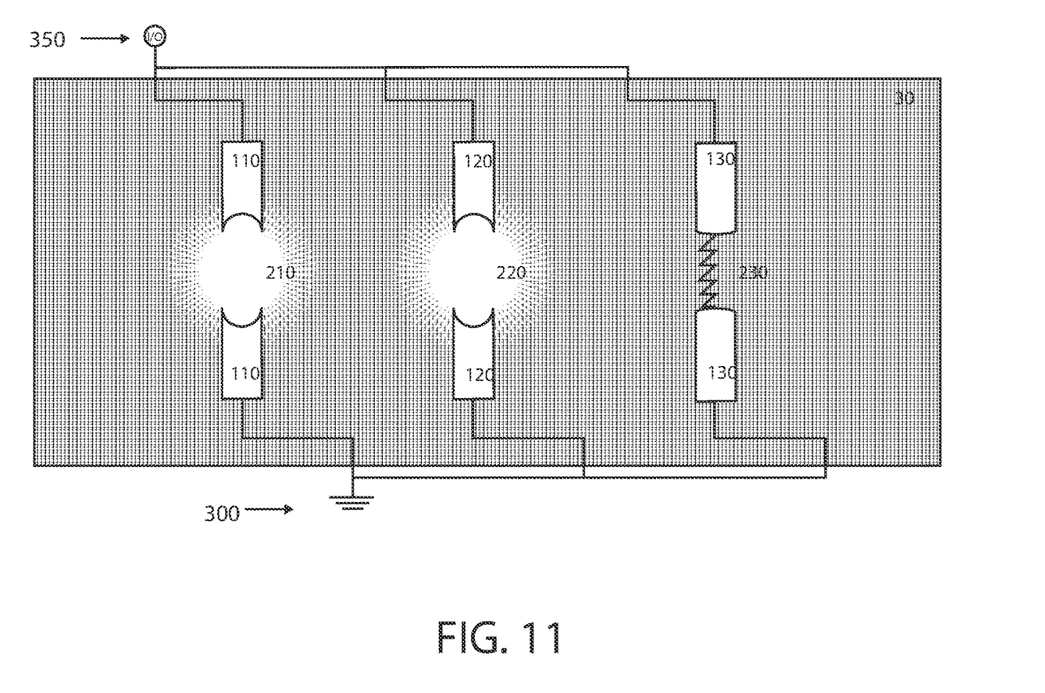
FIG. 11 Is a top-down cross-sectional view of a spark gap with three electrode pairs where the epoxy plastic they are embedded in has a higher breakdown voltage than the gas of the combusted cavity gap with the electrodes of the second gap now being heavily damaged and a spark crossing the last epoxy plastic filled gap.
Figure 12:
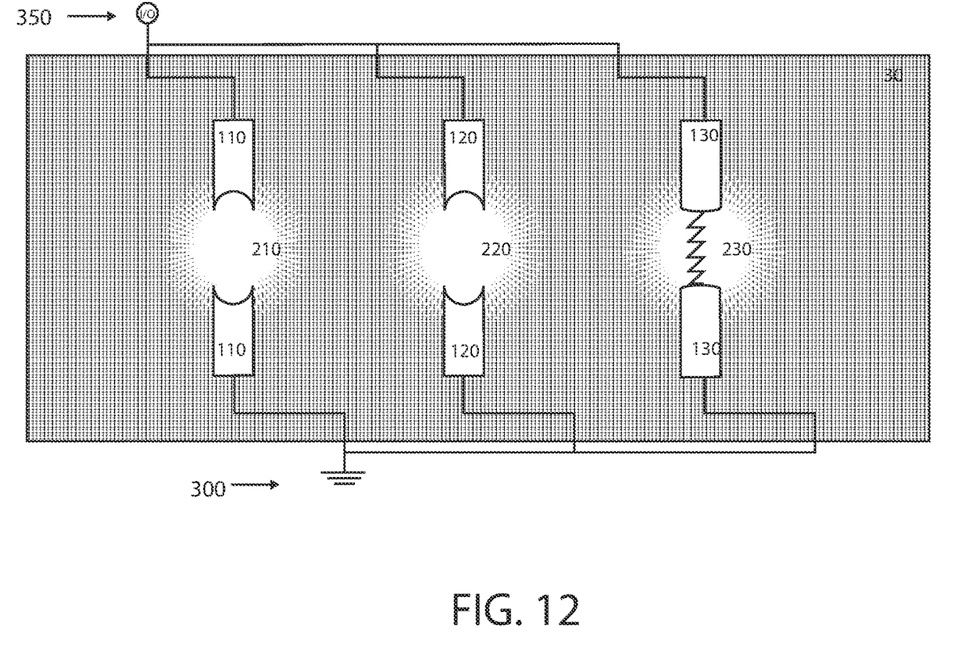
FIG. 12 Is a top-down cross-sectional view of a spark gap with three electrode pairs where the epoxy plastic they are embedded in has a higher breakdown voltage than the gas of the combusted cavity gap, with the second gap now being a combusted cavity and a spark crossing that cavity.
Figure 13:
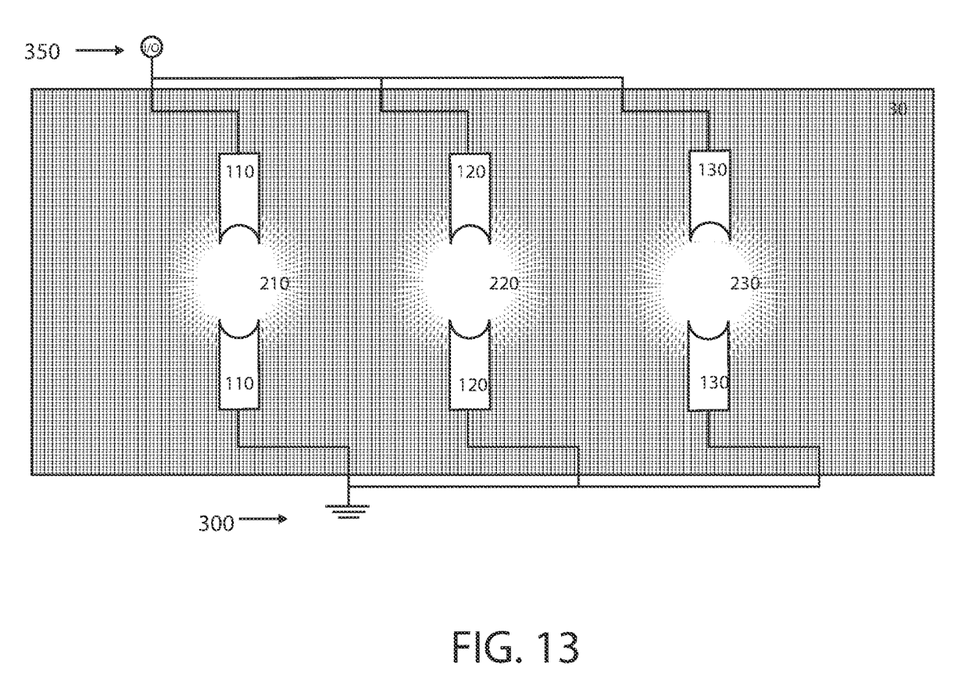
FIG. 13 Is a top-down cross-sectional view of a spark gap with three electrode pairs where the epoxy plastic they are embedded in has a higher breakdown voltage than the gas of the combusted cavity gap, with the electrodes of the last gap now being heavily damaged.

As shown in FIG. 11, the new combustion cavity gap 220 created by the spark in FIG. 10 will receive discharge events. Once the electrode pair receiving the discharge, here 120, has been damaged the new electrode pair, here 130, will receive the spark. The new combustion cavity 130 shown in FIG. 12 will continue to receive the spark until electrode pair 130 becomes damaged as shown in FIG. 13. Once the final pair of electrodes is damaged and can no longer receive an ESD event the spark gap will no longer be able to protect against such events. Therefore, from FIG. 6-FIG. 13 it can be seen that when the spark gap of the present invention with a plurality of electrode pairs is embedded into an epoxy plastic that has a higher breakdown voltage than air at 12 microns or less, each individual electrode pair is used up before the next one begins to receive ESD events.

In an exemplary embodiment, the electrode pairs are to be spaced 12 microns or less apart. However, in alternative embodiments, they may be spaced greater than 12 microns apart. The distance the electrodes are apart affects the breakdown voltage over the gap, by increasing the distance the electrodes are apart there is an increase in the amount of material in the gap and thus the needed voltage to break down the gap is increased.

The electrodes may be created by plating, for example, by electroplating, and the epoxy plastic placed by ordinary means.

Electroplating with dry film will work to form a gap that is 5 microns across or larger. However, past that point, the dry film loses stability and the reliability decreases. To increase yield, and improve reliability for gaps smaller than 5 microns, pigtail plating may be used. Pigtail plating may be used to expand previously plated electrodes so that they begin to cross the gap, and even touch if desired. However, it is beneficial for the purpose of having a spark gap to leave a gap between the electrodes. Several example gap lengths which may be practically useful are, 5 microns and 1 micron, but in general, pigtail plating shines in getting gaps of less than 5 microns.

Figure 14:
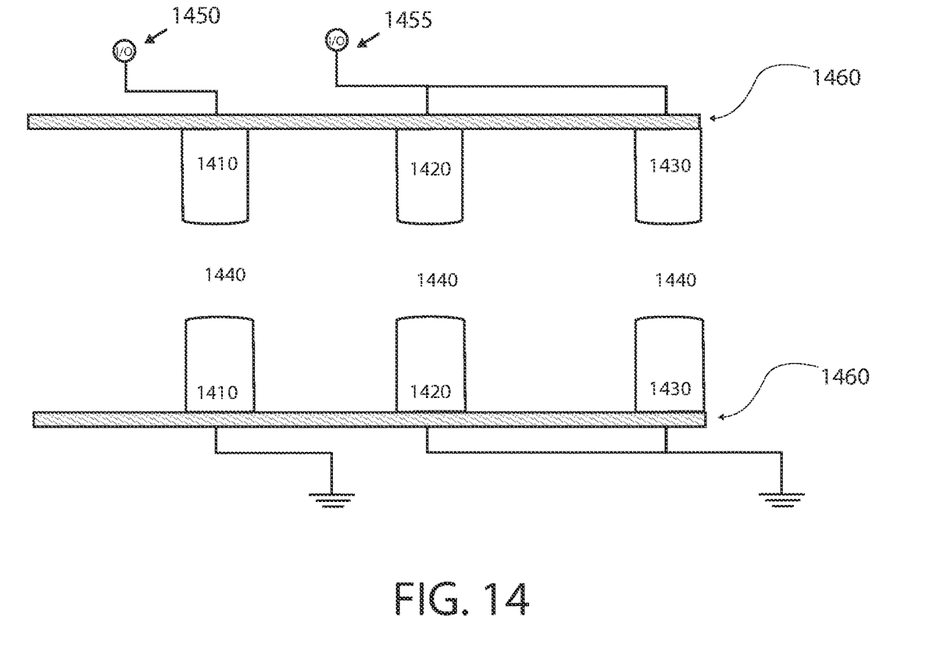
FIG. 14 Is a top-down cross-sectional view of three electrode pairs having a pigtail connection between electrodes in preparation for pigtail plating.

It is worth examining pigtail plating in detail. FIG. 14, shows a series of electrodes, electrode pair 1410, electrode pair 1420, and electrode pair 1430 having been formed by a dry film electroplating process. Electrodes are connected by pigtails 1460. Electrodes of each pair have an initial gap of 1440. The distance of the initial gap may vary. For the purposes of this explanation, each of the electrode pairs of FIG. 14 is 5 microns apart, but pigtail plating may occur at any distance.

It is also worth noting that, in an exemplary embodiment, it may be the case that only one side of the electrode pairs receives a pigtail plating treatment.

It is worth noting that electrode pairs 1420 and 1430 do not share an input: Electrode pair 1430 has input 1450 and electrode pair 1430 has input 1455. However, they are connected here by the pigtail 1460. This connection is important for the purposes of demonstrating that a single pigtail plating step is possible even when the electrodes share different I/O.

In an exemplary method of forming the spark gap, the electrodes are plated by a dry film process onto a semiconductor plastic, and a pigtail, in preparation for pigtail plating, is included (the result is shown in FIG. 14). Once the dry film is removed, the pigtail plating process can occur. pigtail plating grows the electrodes which causes them to reduce and even potentially close the gap. Once the electrodes have closed down the gap to a desired minimum distance, a dry film can be placed over the electrodes and the pigtails removed, for example, by etching.

It is worth noting that pigtail plating may occur as a method of plating the electrode with a secondary coating, like a suite of armor, regardless of how far apart the electrodes are. But when used for the purpose of reducing the gap it is best to start as close as reliably possible. No matter how far apart the electrodes of the initial gap are, the pigtail plating will affect the distance of the gap, causing what may be referred to as a secondary gap to be formed. This secondary gap may have a different length than the initial gap.

Figure 15:
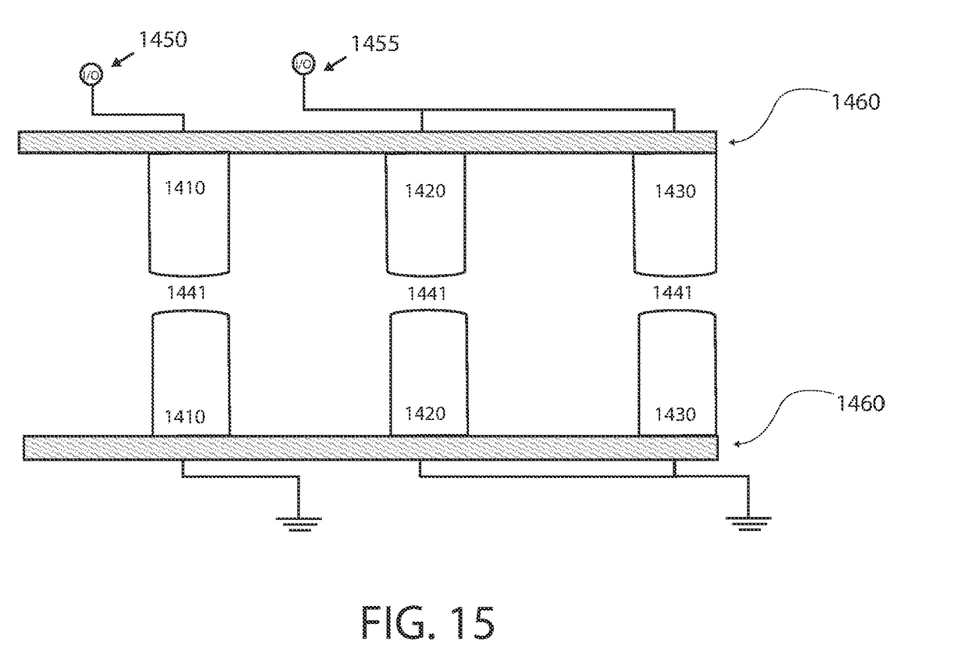
FIG. 15 Is a top-down cross-sectional view of three electrode pairs having a pigtail connection between electrodes after undergoing a pigtail plating process. The electrodes and pigtails have expanded in comparison to FIG. 14 (not to scale).
Figure 16:
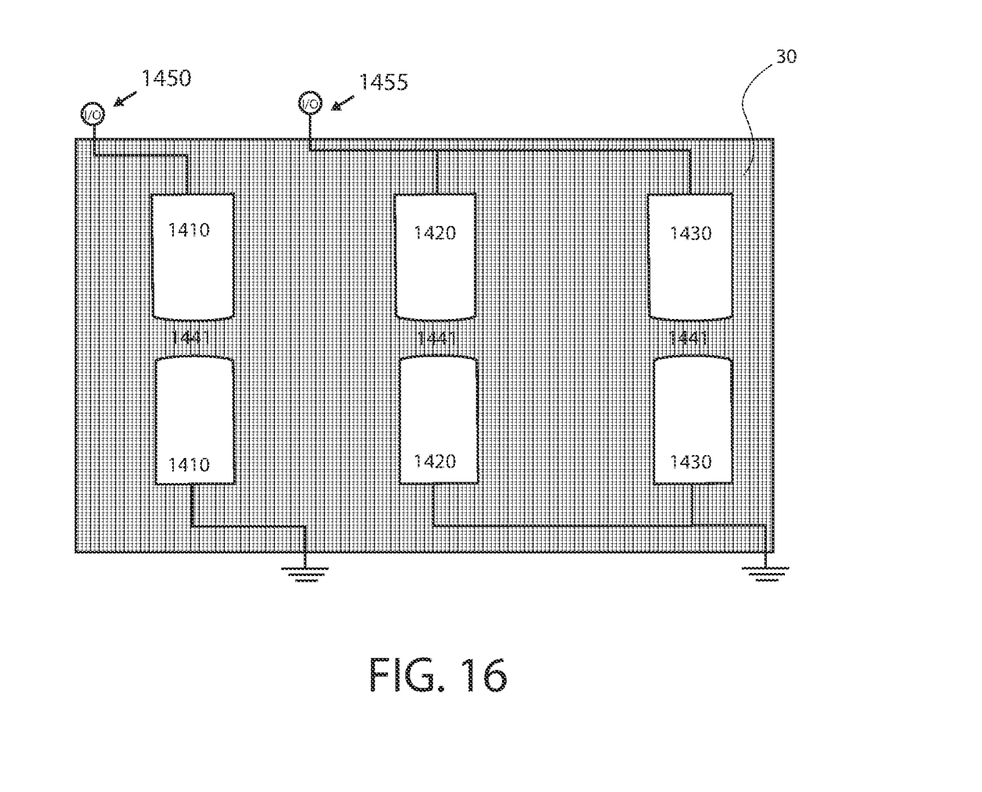
FIG. 16 Is a top-down cross-sectional view of three electrode pairs no longer having a pigtail connection between electrodes and where the electrodes have now been embedded in a multi-layer semiconductor plastic.

FIG. 15 shows electrode pairs, 1410, 1420, and 1430 having grown and closed the distance between gaps. These gaps may be referred to as the secondary gaps 1441 when describing the process of forming the spark gap as these gaps have a reduced size when compared to the initial gaps (for example, gaps 1440 in FIG. 14). It will be appreciated, in FIG. 15, that the pigtails 1460 have not yet been removed. It is worth noting that the pigtails have connected previously unconnected I/O. This is okay for the plating process, as these pigtails can be removed to separate the electrode pairs after the plating is completed. FIG. 16 shows electrode pairs, 1410, 1420, and 1430 with the pigtails now removed and the electrodes embedded in plastic 30.

Once pigtail plating is completed the electrodes may be encapsulated with build-up film or other semiconductor plastic to form a spark gap. This plastic which embeds the gap may be combusted in the manner described above in the discussion of forming combusted cavities in the gap.

Reducing the gap between electrodes will significantly reduce the voltage required to trigger an ESD event. For example, at 12 microns a typical build-up film epoxy used in semiconductors may have a breakdown voltage of 900 volts. But, decreasing the space between electrodes as discussed above, will lower that breakdown voltage. Breakdown voltages of under 900 volts become possible, even without a change in the materials, in fact, breakdown voltages of under 300 volts, even less than 200 volts, become possible. In fact 75 volts or less becomes possible.

Besides closing the distance between the electrodes of an electrode pair, pigtail plating may be used to plate the electrodes. This allows for metals, including nickel, to be plated to help improve the lifespan of the electrode. Because electrodes may be formed with a dry film process before pigtail plating occurs, an electrode may be formed, and an additional layer of metal deposited to coat the electrode-populating it. This formed and plated electrode can receive a pigtail layer that is a different metal than the plating or even the electrode underneath it. In an exemplary embodiment pigtail plating itself may be used to form a plating for the electrode.

Figure 17:
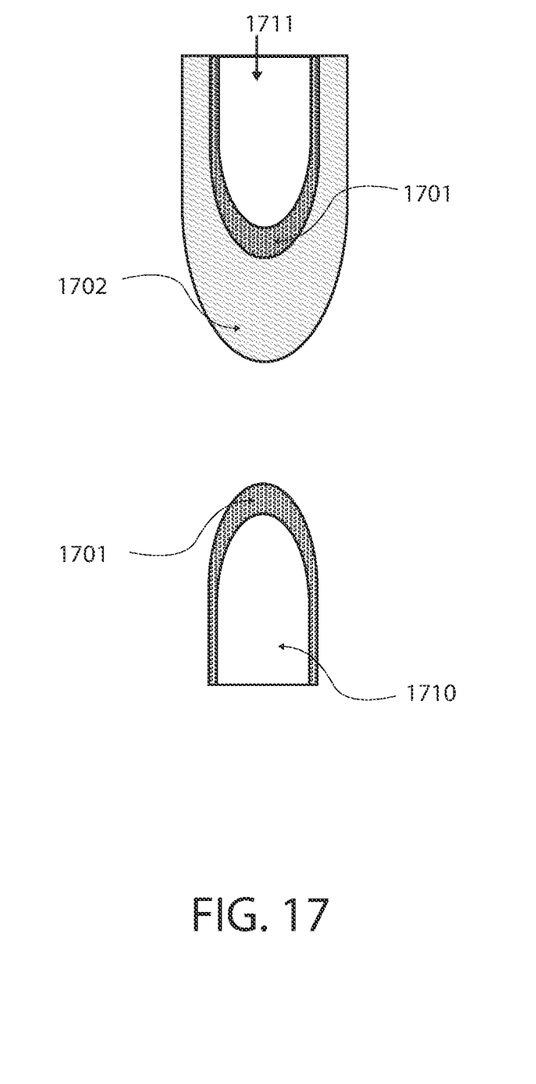
FIG. 17 is a top-down view of an electrode pair, the first electrode receiving two plates as described below and the second electrode receiving only one plating.

FIG. 17 shows an electrode 1711 having been plated with a first metal 1701 and a second metal 1702. Both layers may be from pigtail plating or the first layer 1701, may be from electroplating, and the second layer, 1702 may be from pigtail plating. Pigtail plating can be used to stack multiple layers onto an electrode. Across from electrode 1711 is electrode 1710. Electrode 1710 has one-layer 1701 plated onto it. This demonstrates that electrodes can receive different layers from other electrodes even if they are in the same electrode pair.

Pigtail plating may further be used to increase the thickness of the electrodes in general simply by pigtail plating the same metal as the electrode as this will increase the survivability of the electrode across multiple ESD events without resorting to layering or plating additional metals.

Because of, but not limited to, the size, ease of manufacturing, level of protection, and location of the spark gap, this invention reduces the required die size and cost of ESD protection while increasing the survivability of the IC over multiple ESD events. This is achieved by embedding the spark gaps in semiconductor packing material so that a first spark will combust the gap and replace a portion of the gap material with a gas which typically has a lower breakdown voltage than the plastic.

The drawings and figures show multiple embodiments and are intended to be descriptive of particular embodiments but not limiting with regard to the scope number, or style of the embodiments of the invention. The invention may incorporate a myriad of styles and particular embodiments. All figures are prototypes and rough drawings: the final products may be more refined by one of skill in the art. Nothing should be construed as critical or essential unless explicitly described as such. Also, the articles "a" and "an" may be understood as "one or more." Where only one item is intended, the term "one" or other similar language is used. Also, the terms "has," "have," "having," or the like are intended to be open-ended terms.

I claim:

1. A method of forming a spark gap apparatus comprising;
    forming at least two electrodes which make at least one electrode pair having an initial gap and a pigtail operably connected to the electrodes;
    expanding at least one of the electrodes by subjugating the electrode to a pigtail plating process forming a secondary gap; and embedding the electrodes and the secondary gaps in a semiconductor plastic.

2. The method of forming a spark gap apparatus of claim 1, further comprising the step of removing at least a portion of the pigtails before encapsulating the electrodes in a semiconductor plastic.

3. The method of forming a spark gap apparatus of claim 1, wherein the initial gap of at least one electrode pair has a 5-micron gap distance.

4. The method of forming a spark gap apparatus of claim 1, wherein the pigtail plating results in a secondary gap that is less than 5 microns between each electrode of an electrode pair.

5. The method of forming a spark gap apparatus of claim 4, wherein the pigtail plating results in a secondary gap that is 1 micron between each electrode of an electrode pair.

6. The method of forming a spark gap apparatus of claim 1, wherein the pigtail plating occurs and plates a metal that differs from the electrode.

7. The method of forming a spark gap apparatus of claim 1, further comprising forming a secondary metal deposit over at least one of the electrodes before proceeding to expand the electrodes, the secondary metal deposit portion of the electrode now being expanded in place of the electrode itself.

8. The method of forming a spark gap apparatus of claim 7 wherein the pigtail plating deposits a different metal than the secondary metal deposit.

9. The method of forming a spark gap apparatus of claim 1, wherein the electrode plating is a nickel, a nickel-phosphorus, an alloy of nickel Iron, or a titanium plating.

10. The method of forming a spark gap apparatus of claim 1 wherein the electrodes are copper.

11. The method of making a spark gap of claim 1, wherein the electrodes each come to an angular point that points to the electrode they are paired with.

12. The method of making a spark gap of claim 1, wherein the electrodes have a rounded shape.

13. The method of forming a spark gap apparatus of claim 1, further comprising, after embedding the spark gap in a semiconductor plastic, creating an initial electrostatic discharge between the electrodes of at least one electrode pair so that the semiconductor plastic embedding the gap combusts and forms a combusted cavity gap.

14. The method of forming a spark gap apparatus of claim 13, wherein the resulting combusted cavity gap has a tuned frequency.

15. The method of making a spark gap of claim 13, further comprising creating one electrostatic discharge event per electrode pair until the semiconductor packaging epoxy plastic of the gap until every electrode pair is replaced with a combusted cavity gap.

16. The method of making a spark gap of claim 15, further comprising, after all of the electrode pair gaps are replaced with a combusted gap, at least one future electrostatic event occurring across at least one combusted gap.

17. The method of making a spark gap of claim 1, further comprising forming the spark gap on the same layers in a semiconductor package as traces and other embedded components such as inductors, capacitors, and resistors.

18. The method of making a spark gap of claim 1, wherein a breakdown voltage of the secondary gap is less than 300 volts.

19. The method of making a spark gap of claim 1, wherein a breakdown voltage of the secondary gap is less than 200 volts.

20. The method of making a spark gap of claim 1, wherein only one of the electrodes of each of the electrode pairs is enlarged by pigtail plating.

* * * * *